United States Patent
Barton et al.

(10) Patent No.: US 10,404,224 B2
(45) Date of Patent: Sep. 3, 2019

(54) RF-INPUT LOAD MODULATED BALANCED AMPLIFIER

(71) Applicant: The Regents of the University of Colorado, a body corporate, Denver, CO (US)

(72) Inventors: Taylor W. Barton, Boulder, CO (US); Prathamesh H. Pednekar, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 15/828,353

(22) Filed: Nov. 30, 2017

(65) Prior Publication Data

US 2018/0205348 A1    Jul. 19, 2018

Related U.S. Application Data

(60) Provisional application No. 62/428,433, filed on Nov. 30, 2016, provisional application No. 62/546,337, filed on Aug. 16, 2017.

(51) Int. Cl.
*H03F 3/18* (2006.01)
*H03F 3/189* (2006.01)
(Continued)

(52) U.S. Cl.
CPC ............. *H03F 3/189* (2013.01); *H03F 1/56* (2013.01); *H03F 1/565* (2013.01); *H03F 3/20* (2013.01);
(Continued)

(58) Field of Classification Search
CPC ....................................................... H03F 3/189
See application file for complete search history.

(56) References Cited

U.S. PATENT DOCUMENTS

| | | | | |
|---|---|---|---|---|
| 2002/0077066 A1* | 6/2002 | Pehlke | ................ | H03F 1/0266 455/73 |
| 2002/0136325 A1* | 9/2002 | Pehlke | ................ | H03F 1/0222 375/300 |

(Continued)

*Primary Examiner* — Patricia T Nguyen
(74) *Attorney, Agent, or Firm* — FisherBroyles, LLP; Thomas J. Osborne, Jr.

(57) ABSTRACT

In various implementations of a load modulated balanced amplifier (LMBA), a control signal is generated (e.g., automatically generated) based at least in part on an input signal. The LBMA generally comprises a balanced amplifier, an input splitter, and a control path. A common theme of the different variants described below is that we use a nonlinear characteristic to generate a power-dependent asymmetry in the relative output power levels of the balanced and control amplifiers. This power-depended asymmetry results in dynamic load modulation of the balanced amplifiers, which in turn provides improved efficiency. In one implementation, for example, an LMBA comprises a pair of primary amplifiers collectively providing a balanced amplifier and a control amplifier coupled to the balanced amplifier and adapted to provide a control signal to the balanced amplifier. The control amplifier is adapted to automatically generate the control signal based at least in part upon the input signal to provide load modulation of the balanced amplifier.

19 Claims, 5 Drawing Sheets

(51) Int. Cl.
  *H03F 1/56*    (2006.01)
  *H03F 3/20*    (2006.01)
  *H03F 3/24*    (2006.01)
  *H03F 3/60*    (2006.01)

(52) U.S. Cl.
  CPC ............ *H03F 3/245* (2013.01); *H03F 3/602* (2013.01); *H03F 2200/451* (2013.01)

(56) References Cited

U.S. PATENT DOCUMENTS

2014/0347125 A1* 11/2014 Mohamed ............... H03F 3/602
  330/124 R
2015/0116039 A1* 4/2015 Ahmed ................. H03F 1/0233
  330/295
2015/0155838 A1* 6/2015 Embar ...................... H03F 1/56
  330/295
2017/0359031 A1* 12/2017 Haynes .................. H03F 3/193

* cited by examiner

RF-INPUT LOAD MODULATED BALANCED AMPLIFIER

CROSS-REFERENCE TO RELATED APPLICATIONS

This application claims the benefit of U.S. provisional application No. 62/428,433, filed 30 Nov. 2016 and U.S. provisional application No. 62/546,337 on Aug. 16, 2017, each of which is hereby incorporated by reference as though fully set forth herein.

BACKGROUND a. Field

The instant disclosure relates to load modulated balanced amplifiers (LMBAs).

b. Background

In load modulated balanced amplifiers (LMBAs), RF power is combined from multiple individual power amplifiers (PAs)—two "main" PAs that comprise a balanced amplifier configuration, and one "control" PA. These PAs interact through a passive combining network such that the overall system output power is a function of the relative amplitude and phases of the multiple signals provided to the combining network. When an appropriate combining structure is used, the control PA interacts with the balanced amplifier PAs such that the load impedance seen by the main PAs is a function of variations in relative phase and amplitude of the control PA signal.

FIG. 1 shows an example load modulated balanced amplifier including two separate sources that generate a modulated RF input signal and a modulated RF control signal. Examples of this approach are described in D. Shepphard, J. Powell, S. Cripps, "An efficient broadband reconfigurable power amplifier using active load modulation." IEEE Microwave and Wireless Components Letters, vol. 26, no. 6, June 2016 [Shepphard 1] and D. Shepphard, J. Powell, S. Cripps, "A broadband reconfigurable load modulated balanced amplifier (LMBA)," IEEE Int. Microwave Symposium, June 2017, pp. 1-3 [Shepphard 2]. In these approaches, however, the control signal is generated from an RF source that is separate from an input signal source, i.e., two sources are used. Balanced amplifiers use a related technique, but have no control signal injection.

BRIEF SUMMARY

In various implementations of a load modulated balanced amplifier (LMBA), a control signal is generated (e.g., automatically generated) based at least in part on an input signal. The LBMA generally comprises a balanced amplifier, an input splitter, and a control path, such as shown in the block diagram of FIG. 2. A common theme of the different variants described below is that we use a nonlinear characteristic to generate a power-dependent asymmetry in the relative output power levels of the balanced and control amplifiers. This power-depended asymmetry results in dynamic load modulation of the balanced amplifiers, which in turn provides improved efficiency.

In one implementation, for example, an LMBA comprises a pair of primary amplifiers collectively providing a balanced amplifier and a control amplifier coupled to the balanced amplifier and adapted to provide a control signal to the balanced amplifier. The control amplifier is adapted to automatically generate the control signal based at least in part upon the input signal to provide load modulation of the balanced amplifier.

The foregoing and other aspects, features, details, utilities, and advantages of the present invention will be apparent from reading the following description and claims, and from reviewing the accompanying drawings.

DETAILED DESCRIPTION

Figure 1:
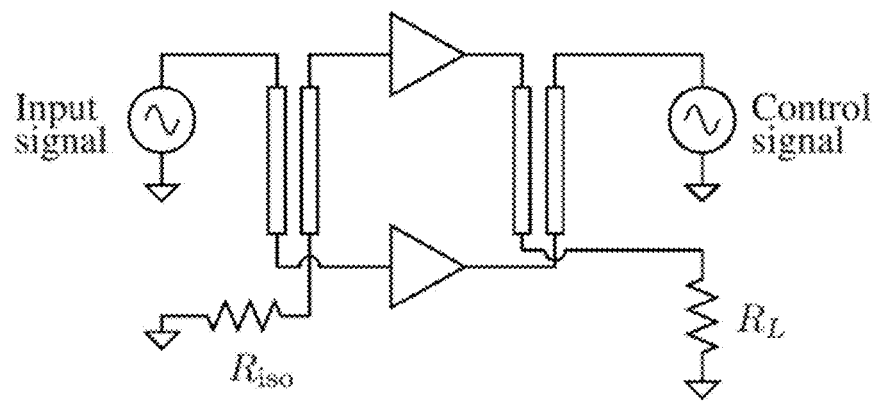
FIG. 1 shows a load modulated balanced amplifier including two separate sources used to generate
Figure 2:
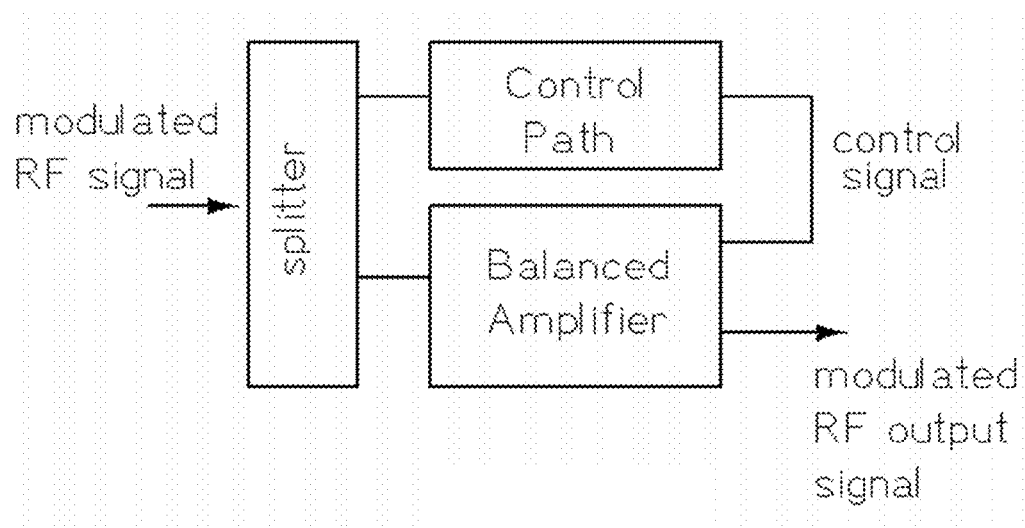
FIG. 2 shows a block diagram of an example implementation of an LMBA, according to one or more implementations of the present invention.

In various implementations of a load modulated balanced amplifier (LMBA), a control signal is generated (e.g., automatically generated) based at least in part on an input signal. The LBMA generally comprises a balanced amplifier, an input splitter, and a control path, such as shown in the block diagram of FIG. 2. A common theme of the different variants described below is that we use a nonlinear characteristic to generate a power-dependent asymmetry in the relative output power levels of the balanced and control amplifiers. This power-depended asymmetry results in dynamic load modulation of the balanced amplifiers, which in turn provides improved efficiency.

In some implementations, for example, an efficient PA directly amplifies a modulated RF signal without additional controls or other inputs required. In these implementations, this can allow the PA to serve as a drop-in replacement for other standard PAs such as conventional single-transistor designs, RF-input Doherty amplifiers (the current topology of choice for the commercial basestation industry) etc., with advantages including reduced baseband signal processing and the ability to work with standard linearization methods.

In some implementations, a need for control signal generation may be addressed such as by introducing a "control path" that automatically generates a control signal based on a single modulated RF input. We observed that the load impedance seen by the balanced amplifier transistors can be dynamically modulated as the desired power level changes. Advantages of dynamic load modulation include improved efficiency at backed-off power levels (e.g, 6-8 dB below peak power), which can be important in many modern systems because of the high peak-to-average power ratio of the signals to be amplified. In one "RF-input LMBA" architecture, for example, it can be assumed that the main transistors are either pre-matched for power (i.e., they produce maximum output power when the reflection coefficient of the load is minimized), or not matched at all. As the output power is reduced, the RF-input LMBA modulates the reflection coefficient (load) to move away from the power match point and towards the impedance that produces highest efficiency at back-off. In terms of the original LMBA, the control signal amplitude is smallest at high output powers, and largest at back-off. This relationship between the control signal power and the balanced amplifier power can be achieved by introducing a compression characteristic in the control PA that causes its power relative to the balanced amplifier to vary in the desired way. This RF-input LMBA architecture is described in U.S. provisional application No. 62/428,433, filed 30 Nov. 2016 (the '433 application), and a wideband variant is also described in U.S. provisional application No. 62/546,337 on Aug. 16, 2017 (the '337 application), each of which has been incorporated by reference herein.

Other implementations also address the need for control signal generation in a typical Load Modulated Balanced Amplifier (LMBA) approach. Here, an approach for pre-matching and biasing can be used to improve performance and make the LaMBDA more compatible with existing linearization techniques, making it more attractive for commercial applications. In one LaMBDA approach, the control amplifier is biased in a class C mode. As a result of this bias, there are two operating modes. At low input power, the class C control PA does not receive enough drive to turn on, and so it remains off and does not contribute to the LaMBDA output. In this case, the LaMBDA behaves essentially as a conventional balanced amplifier, and the small input power means that the loading on the balanced amplifier PAs is close to the characteristic impedance of the system (in our demonstration, 50 ohms). When the input power increases, the control PA turns on, injecting an input-power-dependent signal into the coupler's isolation port. As the relative input power of the control PA increases, so does the reflection coefficient "seen" by the balanced amplifier components, thus resulting in dynamic load modulation. This dynamic load modulation trajectory is selected to improve the efficiency of the balanced amplifier over the high-power operating regime.

Other LaMBDA implementations also address frequency dependence and could be designed to operate over at least an octave bandwidth using techniques, such as described in the '337 application. This potential for wide bandwidth makes it applicable to many emerging systems, potentially including 5G systems and carrier aggregation. For comparison, the conventional Doherty PA has bandwidths on the order of 10-20%, substantially less than the 67% fractional bandwidth of an octave band PA.

Figure 3:
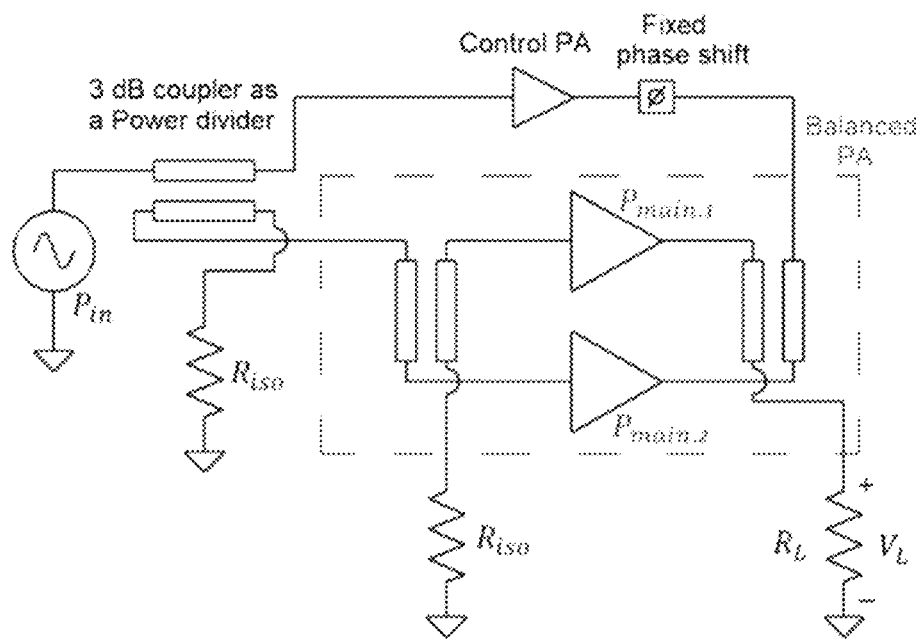
FIG. 3 shows a schematic diagram of an example implementation of an LMBA, according to one or more implementations of the present invention.

FIG. 3 shows a schematic drawing of an example implementation of a LBMA. In this particular implementation, a control signal is generated such that its power relative to the power output from the balanced amplifiers decreases as the overall output power increases. The result of this relationship is that the balanced amplifier devices are dynamically load modulated based on a desired output power. The load modulation is designed to improve efficiency at low output power levels. In principle, it could also/instead be used to improve linearity.

In one particular implementation, for example, branch PAs are assumed to have peak output power at (or near) $|\Gamma|=0$, and a desired load impedance trajectory (i.e., through the point of peak PAE) an angle of $\Gamma=\theta_0$. The objective in this implementation is to generate a control signal that tracks this load trajectory: i.e. provide the correct phase (assumed constant at a given frequency), and an amplitude that increases as the desired output power decreases. The former requirement is straightforward to meet (for narrowband signals), through either fixed or variable phase shift networks. The control signal power level requirement can be more difficult due to the inverse relationship between $P_{in}$ and $P_{ctrl}$. We note, however, that $|P_{ctrl}|$ only needs to decrease relative to $P_{in}$, not in an absolute sense. To implement this relationship, a "control" PA with a nonlinear input-output characteristic can be introduced as shown in FIG. 3. The control PA can be designed to saturate at a lower power (and with a sharper saturation nonlinearity), so the relative control power $P_{rel}$ (relative to the main PAs' output power level) decreases with input drive. In this manner, the modulated RF input signal $P_{in}$ results in both modulated drive amplitude to the main PAs and a modulated load impedance. Compared to drive modulation alone, this can result in increased efficiency.

The relative phase of the control signal with respect to the output of the main PAs can ensure that the impedance trajectory intersects the peak PAE impedance point for the main PAs. In one implementation, for example, the control path phase can be set using the transmission line length at the input to the control PA in simulation. If desired, a phase tuner can be inserted before the input to the control PA and used to rotate the loading trajectory seen by the main PAs. Note that this phase adjustment is more practical than offset line adjustment in a conventional outphasing architecture, as it can be performed on the low-power input signal.

Although in some implementations, a system may provide moderate bandwidth (e.g., 29%), note that a wide bandwidth offered by an original approach in D. Shepphard, J. Powell, S. Cripps, "A broadband reconfigurable load modulated balanced amplifier (LMBA)," IEEE Int. Microwave Symposium, June 2017, pp. 1-3, which is hereby incorporated by reference herein in its entirety, may also be achievable in RF-input form by controlling the phase response. As with the amplitude control strategy, note that it is the relative phase between the main PA paths and the control signal path that are controlled, and therefore a similar approach can be used in which the dispersion of the appropriate path can be increased in order to control the relative phase response. For example, a phase compensation network can be inserted in the main path that has a frequency-dependent phase shift corresponding to the (counter-clockwise) rotation in the F plane needed to maintain a load trajectory passing through the frequency-dependent peak PAE point of the main PAs.

An example proof-of-concept prototype is designed for operation over 700-940 MHz using the Wolfspeed CGH40010 (10 W) packaged GaN device in the main PAs and CGH40006 (6 W) packaged device in the control path. The 90° hybrid couplers are implemented using commercial off the shelf (COTS) components. However, one of skill in the art would recognize that this is merely an example implementation and many other implementations are contemplated.

Figure 4:
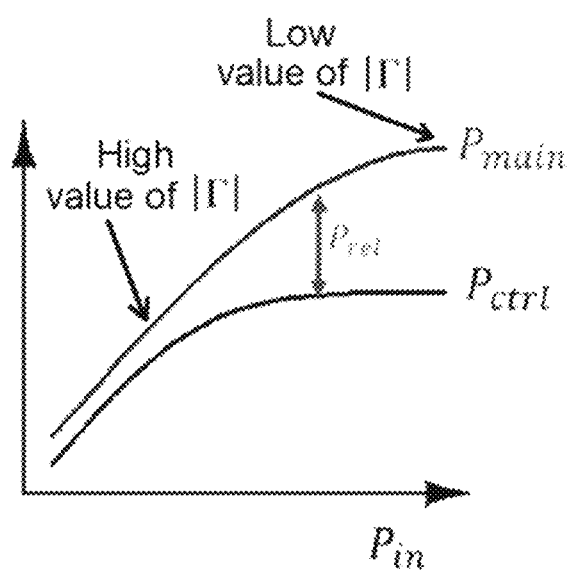
FIG. 4 shows a graph depicting example power amplifier compression characteristics corresponding to the example LMBA, according to one or more implementations of the present invention.

In this implementation, where the compressive characteristic of the control path (relative to the balanced amplifier path) is implemented using a control PA that compresses at a lower input power level than the balanced amplifier path. The notional compression characteristics of the control and balanced paths in one example implementation are shown in FIG. 4. In FIG. 4, $P_{main}$ refers to the power from the Pas comprising the balanced amplifier.

Because of the compressive characteristic, the reflection coefficient magnitude seen by the amplifiers comprising the balanced amplifier is large at low power levels and low at high power levels. The amplifiers can therefore be designed such that they produce a high output power for a low reflection coefficient and a high efficiency (at lower output power level) when loaded with a high reflection coefficient. A fixed phase shift in the control PA path can be used to provide the appropriate load for high efficiency at low power levels.

The RF-input LMBA shown in FIG. 3 offers an example implementation of an LMBA approach that can operate directly on a modulated RF signal without requiring external control signal generation. This particular approach eliminates a baseband signal computation that would otherwise be required for modulated signals in the prior LMBA implementations. In addition to the relative simplicity of the approach, one potential benefit is that it can avoid nonlinear baseband signal computation and any associated bandwidth expansion. Compared to the prior LMBA implementations, the simplicity of the $RF_{input}$ approach trades off with the wide-range load impedance control offered by an externally-generated control signal.

Figure 5:
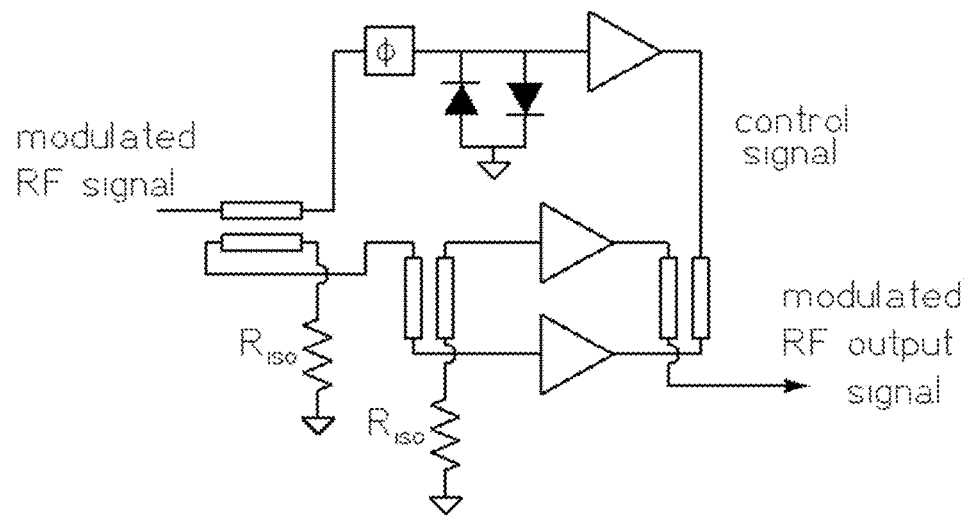
FIG. 5 is a schematic diagram showing another example implementation of an RF-input/RF-output LMBA implemented using a compressive control path with a compressive nonlinear element, according to one or more implementations of the present invention.

FIG. 5 is a schematic diagram showing another example implementation of an RF-input/RF-output LMBA implemented using a compressive control path with a compressive nonlinear element, such as but not limited to a limiter, followed by a linear power amplifier. In this example implementation, the compressive characteristics in the LMBA in of FIG. 3 can be implemented with another nonlinear element with a compressive characteristic, instead of sizing the power amplifier as in FIG. 3. In the particular implementation of FIG. 5, for example, the control path can be implemented using a limiter followed by a linear power amplifier.

Figure 6:
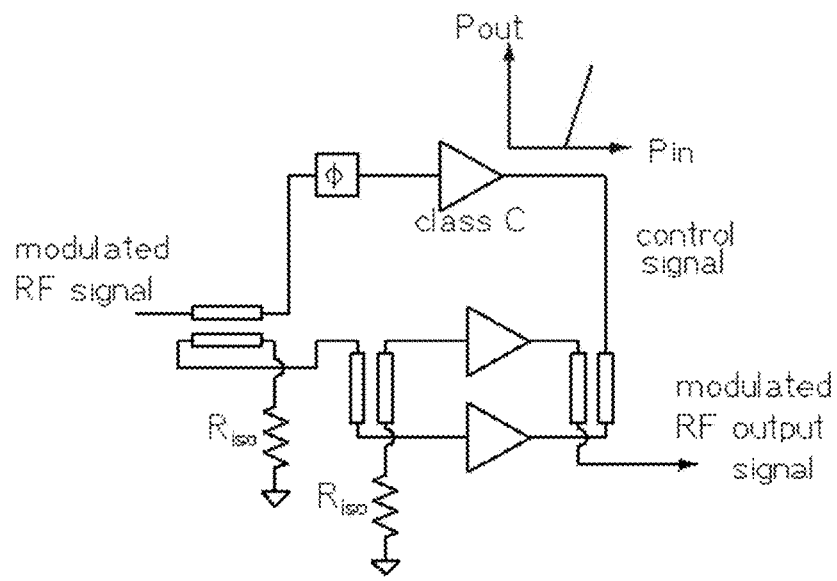
FIG. 6 is a schematic diagram showing an example RF-input/RF-output LMBA including an scheme for the control path that increases the back-off range and improves the back-off efficiency while maintaining the RF-input nature of the architecture, according to one or more implementations of the present invention.

FIG. 6 is a schematic diagram showing yet another implementation of an RF-input/RF-output LMBA implemented with an expansive control path implemented with a class-C based power amplifier. In this implementation, the control signal is generated such that its power relative to the power output from the balanced amplifiers increases as the overall output power decreases. This is similar to the implementation shown in FIG. 3 but results in the opposite sense of load modulation: the reflection coefficient magnitude seen by the main PAs is small at low power levels and low at high power levels.

In this implementation, the control signal is generated from the input signal using a class-C biased control amplifier, which has the desired characteristic that it produces very little/no power at low input levels, and a nonlinearly increasing output power as the input power level is increased above some threshold. The main amplifiers can be designed for this variant such that they produce a high output power for a high reflection coefficient and a high efficiency for a low reflection coefficient. In an example prototype of the implementation of FIG. 6, this approach includes an additional matching network in the balanced amplifier compared to a prototype for the LMBA implementation shown with respect to FIG. 3. One advantage of this approach compared to the LMBA of FIG. 3 is that this implementation can produce a wider range of load impedance and therefore a wider power range over which efficiency is enhanced.

As with the related RF-input LMBA architecture shown in D. Shepphard, J. Powell, S. Cripps, "A broadband reconfigurable load modulated balanced amplifier (LMBA)," IEEE Int. Microwave Symposium, June 2017, pp. 1-3 (Shepphard 2), a load modulated balanced Doherty-like amplifier (LaMBDA) approach employs asymmetry between a main balanced amplifier and a control signal path to produce dynamic load modulation based on the modulated RF input. In Shepphard 2, a control scheme is used in which the amplitude of the control signal is decreased as the desired output power increases. For that approach, it is assumed that the main PAs have optimum output power at (or near) a matched load ($\Gamma$=0). A limitation of this strategy is that it is difficult to reach the maximum output power, as very low control signal amplitude is required for the balanced amplifier loading to reach the center of a Smith chart. This effectively reduces the back-off range, as the load modulation is unable to generate the optimum load.

In FIG. 6, for example, a scheme for the control path is provided that increases the back-off range and improves the back-off efficiency while maintaining the RF-input nature of the architecture. As the name suggests, LaMBDA operates analogously to a DPA, in that the class-C biased control PA turns on at high output power levels to produce load modulation. When the input power is low, the control path is shut off and the LaMBDA operates as a conventional balanced amplifier, with zero reflection coefficient presented to the main devices. Matching networks at the output of the main devices present the optimum PAE load to these transistors in back-off. As the input power increases, the control PA turns on, and starts to generate the control signal. This control signal gradually moves the load, such as from an optimum PAE load to an optimum power load. Compared to the RF-input LMBA shown in FIG. 4, this scheme extends the load trajectory to the center of the Smith chart, a direct consequence of the control power being zero at the output power back-off. Therefore, the LaMBDA PA is able to produce a wider range of load modulation.

Figure 7:
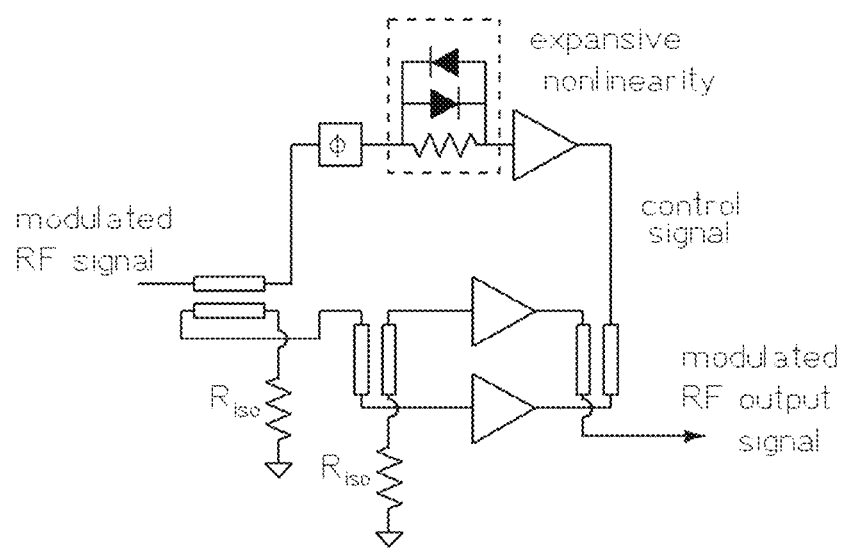
FIG. 7 is a schematic diagram showing another example implementation of an RF-input/RF-output LMBA using an expansive control path implemented with an expansive nonlinear element followed by a power amplifier, according to one or more implementations of the present invention.

FIG. 7 is a schematic diagram showing another implementation of an RF-input/RF-output LMBA using an expansive control path implemented with an expansive nonlinear element followed by a power amplifier. In this implementation, for example, the expansive characteristics of the LMBA implementation shown in FIG. 6 could be implemented with some other nonlinear element with an expansive characteristic instead of a power amplifier. For example a series diode structure could be used, such as shown in FIG. 7.

Figure 8:
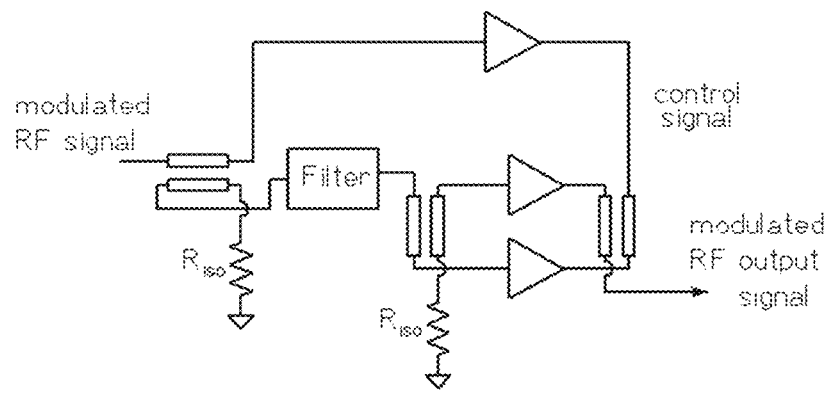
FIG. 8 is a schematic diagram showing another example implementation of a Wideband RF-input/RF-output LMBA using a filter to control a frequency response of the balanced amplifier compared to the control amplifier, according to one or more implementations of the present invention.

FIG. 8 is a schematic diagram showing another example implementation of a Wideband RF-input/RF-output LMBA using a filter to control a frequency response of the balanced amplifier compared to the control amplifier. In this variant the architecture includes a frequency-dependent element to provide an active impedance match across a wide range of frequencies, resulting in a wideband power amplifier. In one example implementation, for example, the frequency compensation element can be implemented using a bandpass filter which can be thought of as part of the splitter element, or as its own element.

Figure 9:
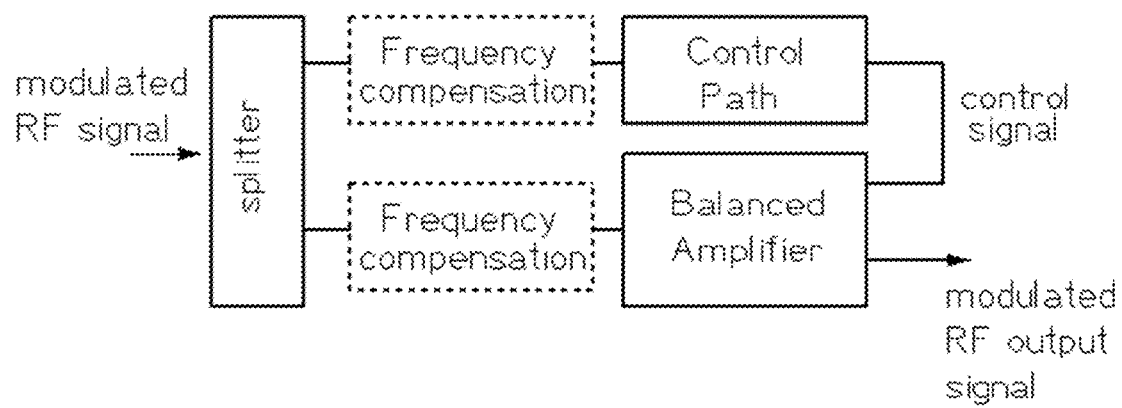
FIG. 9 is a block diagram showing an example implementation of a Wideband RF-input/RF-output LMBA showing example locations of a frequency compensation element, according to one or more implementations of the present invention.

In various implementations, the placement of the frequency compensation element can be in either the balanced amplifier path or the control path, and can depend on the details of the designs of these two paths, such as shown in FIG. 9. For example, in some implementations, the frequency compensation element may be placed in the balanced amplifier path. This approach can be combined with any of the above variants.

The above variants shown and described with respect to FIGS. 2-9 include load modulation at a fundamental operating frequency. In general, a control signal could also be designed to be at, e.g., a harmonic of the fundamental frequency. Harmonic injection has been shown to improve efficiency or linearity, but is typically implemented using a diplexer instead of the structure shown here.

Although implementations have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A Load Modulated Balanced Amplifier (LMBA) comprising:
   a pair of primary amplifiers collectively providing a balanced amplifier; and
   a control amplifier coupled to the balanced amplifier and adapted to provide a control signal to the balanced amplifier,
   wherein the control amplifier is adapted to automatically generate the control signal based at least in part upon the input signal to provide load modulation of the balanced amplifier, and the control amplifier is biased in a class C mode.

2. The LMBA of claim 1 wherein the control signal is generated such that its power relative to the power output from the balanced amplifiers decreases as the overall output power increases.

3. The LMBA of claim 2 wherein the load modulation improves efficiency at relatively low output power levels.

4. A Load Modulated Balanced Amplifier (LMBA) comprising:
   a pair of primary amplifiers collectively providing a balanced amplifier; and
   a control amplifier coupled to the balanced amplifier and adapted to provide a control signal to the balanced amplifier,
   wherein the control amplifier is adapted to automatically generate the control signal based at least in part upon the input signal to provide load modulation of the balanced amplifier, a compressive characteristic of a control path relative to the balanced amplifier path is implemented using a control PA that compresses at a lower input power level than the balanced amplifier path, and the compressive characteristics is implemented with a limiter followed by a linear power amplifier.

5. The LMBA of claim 1 wherein a reflection coefficient magnitude seen by primary amplifiers of the balanced amplifier is relatively large at relatively low power levels and relatively low at relatively high power levels.

6. The LMBA of claim 5 wherein the primary amplifiers are adapted to produce a relatively high output power for a relatively low reflection coefficient and a relatively high efficiency at a relatively lower output power level when loaded with a relatively high reflection coefficient.

7. The LMBA of claim 6 wherein a fixed phase shift in a control amplifier path is used to provide a load for relatively high efficiency at relatively low power levels.

8. The LMBA of claim 1 wherein the control signal is generated such that its power relative to the power output from the balanced amplifiers increases as the overall output power decreases.

9. The LMBA of claim 8 wherein a reflection coefficient magnitude seen by the primary amplifiers is relatively low at relatively low power levels and relatively high at relatively high power levels.

10. The LMBA of claim 1 wherein the control signal is generated from the input signal using the class-C biased control amplifier.

11. The LMBA of claim 10 wherein the control amplifier produces relatively low power at relatively low input levels and a nonlinearly increasing output power as the input power level is increased above a threshold.

12. The LMBA of claim 1 wherein the primary amplifiers are adapted to produce a relatively high output power for a relatively high reflection coefficient and a relatively high efficiency for a relatively low reflection coefficient.

13. The LMBA of claim 1 wherein class-C based power amplifier provides an expansive control path.

14. A Load Modulated Balanced Amplifier (LMBA) comprising:
   a pair of primary amplifiers collectively providing a balanced amplifier; and
   a control amplifier coupled to the balanced amplifier and adapted to provide a control signal to the balanced amplifier,
   wherein the control amplifier is adapted to automatically generate the control signal based at least in part upon the input signal to provide load modulation of the balanced amplifier, and the LMBA comprises an expansive control path comprising a series diode structure.

15. A Load Modulated Balanced Amplifier (LMBA) comprising:
   a pair of primary amplifiers collectively providing a balanced amplifier; and
   a control amplifier coupled to the balanced amplifier and adapted to provide a control signal to the balanced amplifier,
   wherein the control amplifier is adapted to automatically generate the control signal based at least in part upon the input signal to provide load modulation of the balanced amplifier, and the LMBA comprises a wideband power amplifier via a frequency-dependent element to provide an active impedance match across a wide range of frequencies.

16. The LMBA of claim 15 wherein the frequency dependent element can be implemented using a bandpass filter.

17. A Load Modulated Balanced Amplifier (LMBA) comprising:
   a pair of primary amplifiers collectively providing a balanced amplifier; and
   a control amplifier coupled to the balanced amplifier and adapted to provide a control signal to the balanced amplifier,
   wherein the control amplifier is adapted to automatically generate the control signal based at least in part upon the input signal to provide load modulation of the balanced amplifier, and the control signal is at a harmonic of a fundamental operating frequency of the LMBA.

18. The LMBA of claim 1 wherein the control amplifier in a first mode does not contribute to an output of the LMBA.

19. The LMBA of claim 2 wherein the control amplifier in a second mode turns on and injects an input-power dependent signal into a couple isolation port of the balanced amplifier.

* * * * *